United States Patent
Takata

(10) Patent No.: US 12,512,818 B2
(45) Date of Patent: Dec. 30, 2025

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 372 days.

(21) Appl. No.: 18/127,024

(22) Filed: Mar. 28, 2023

(65) Prior Publication Data
US 2023/0231540 A1 Jul. 20, 2023

Related U.S. Application Data

(63) Continuation of application No. PCT/JP2021/035266, filed on Sep. 27, 2021.

(30) Foreign Application Priority Data

Sep. 30, 2020 (JP) ................. 2020-164877

(51) Int. Cl.
*H03H 9/64* (2006.01)
*H03H 9/25* (2006.01)

(52) U.S. Cl.
CPC ............ *H03H 9/6483* (2013.01); *H03H 9/25* (2013.01)

(58) Field of Classification Search
CPC .................................. H03H 9/25; H03H 9/64
See application file for complete search history.

(56) References Cited

U.S. PATENT DOCUMENTS 8,305,160 B2 * 11/2012 Yamamoto ........... H03H 9/6483
333/195
8,736,402 B2 * 5/2014 Takamine .......... H03H 9/14582
333/195

(Continued)

FOREIGN PATENT DOCUMENTS

JP 2015119258 A 6/2015
JP 2017204743 A 11/2017

(Continued)

OTHER PUBLICATIONS

International Search Report in PCT/JP2021/035266, mailed Nov. 30, 2021, 3 pages.

(Continued)

*Primary Examiner* — Andrea Lindgren Baltzell
*Assistant Examiner* — Alan Wong
(74) *Attorney, Agent, or Firm* — Keating & Bennett, LLP

(57) ABSTRACT

A multiplexer includes a first filter and a second filter with a lower pass band than that of the first filter. A longitudinally coupled acoustic wave resonator of the first filter includes an interdigital transducer electrode group of interdigital transducer electrodes having an asymmetric shape with respect to a center line that passes through a center of the interdigital transducer electrode group and is perpendicular or substantially perpendicular to an acoustic wave propagation direction. The interdigital transducer electrodes connected to a first path on a common terminal side when seen from the longitudinally coupled acoustic wave resonator have a smaller aggregate average of electrode finger pitches of the interdigital transducer electrodes and a smaller sum of numbers of pairs of electrode fingers of the interdigital transducer electrodes, compared with the interdigital transducer electrodes connected to the first path on a first terminal side.

20 Claims, 9 Drawing Sheets

(56) References Cited

U.S. PATENT DOCUMENTS

| | | | | |
|---|---|---|---|---|
| 9,159,900 B2* | 10/2015 | Tamasaki | ............... | H10N 30/88 |
| 10,511,283 B2* | 12/2019 | Maeda | ..................... | H03H 9/64 |
| 10,840,888 B2* | 11/2020 | Takata | ............... | H03H 9/02818 |
| 11,070,195 B2* | 7/2021 | Uesaka | .............. | H03H 9/14582 |
| 11,876,505 B2* | 1/2024 | Uesaka | ............... | H03H 9/6436 |
| 11,916,536 B2* | 2/2024 | Takata | ............... | H03H 9/14544 |
| 11,916,542 B2* | 2/2024 | Uesaka | ................... | H03H 9/72 |
| 2011/0156842 A1 | 6/2011 | Takamine | | |
| 2013/0214873 A1 | 8/2013 | Takamine | | |
| 2017/0331456 A1 | 11/2017 | Ono | | |
| 2019/0058452 A1 | 2/2019 | Takata | | |
| 2021/0167750 A1* | 6/2021 | Takata | ................. | H03H 9/6483 |

FOREIGN PATENT DOCUMENTS

| | | | |
|---|---|---|---|
| JP | 2019036856 A | 3/2019 | |
| WO | 2010035372 A1 | 4/2010 | |
| WO | 2012056767 A1 | 5/2012 | |
| WO | 2020044979 A1 | 3/2020 | |

OTHER PUBLICATIONS

Written Opinion in PCT/JP2021/035266, mailed Nov. 30, 2021, 4 pages.

* cited by examiner

FIG. 4A

WORKING EXAMPLE

| INTERDIGITAL TRANSDUCER ELECTRODE | CONNECTING POSITION | AVERAGE PITCH (μm) | NUMBER OF PAIRS OF ELECTRODE FINGERS pn |
|---|---|---|---|
| 31 | FIRST TERMINAL SIDE | 1.7714 | 7 |
| 32 | COMMON TERMINAL SIDE | 1.7495 | 10 |
| 33 | FIRST TERMINAL SIDE | 1.7784 | 18 |
| 34 | COMMON TERMINAL SIDE | 1.7638 | 13 |
| 35 | FIRST TERMINAL SIDE | 1.7775 | 19 |
| 36 | COMMON TERMINAL SIDE | 1.7489 | 9 |
| 37 | FIRST TERMINAL SIDE | 1.7680 | 8 |

FIG. 4B

| INTERDIGITAL TRANSDUCER ELECTRODE | CONNECTING POSITION | AGGREGATE AVERAGE (μm) OF ELECTRODE FINGER PITCHES pt | SUM OF NUMBERS OF PAIRS OF ELECTRODE FINGERS pn |
|---|---|---|---|
| 32,34,36 | COMMON TERMINAL SIDE | 1.7551 | 32 |
| 31,33,35,37 | FIRST TERMINAL SIDE | 1.7756 | 52 |

FIG. 7A

COMPARATIVE EXAMPLE

| INTERDIGITAL TRANSDUCER ELECTRODE | CONNECTING POSITION | AVERAGE PITCH (μm) | NUMBER OF PAIRS OF ELECTRODE FINGERS pn |
|---|---|---|---|
| 131 | COMMON TERMINAL SIDE | 1.7572 | 7 |
| 132 | FIRST TERMINAL SIDE | 1.7346 | 10 |
| 133 | COMMON TERMINAL SIDE | 1.7641 | 18 |
| 134 | FIRST TERMINAL SIDE | 1.7493 | 13 |
| 135 | COMMON TERMINAL SIDE | 1.7626 | 19 |
| 136 | FIRST TERMINAL SIDE | 1.7344 | 9 |
| 137 | COMMON TERMINAL SIDE | 1.7543 | 8 |

FIG. 7B

| INTERDIGITAL TRANSDUCER ELECTRODE | CONNECTING POSITION | AGGREGATE AVERAGE (μm) OF ELECTRODE FINGER PITCHES pt | SUM OF NUMBERS OF PAIRS OF ELECTRODE FINGERS pn |
|---|---|---|---|
| 132,134,136 | FIRST TERMINAL SIDE | 1.7405 | 32 |
| 131,133,135,137 | COMMON TERMINAL SIDE | 1.7611 | 52 |

FIG. 8

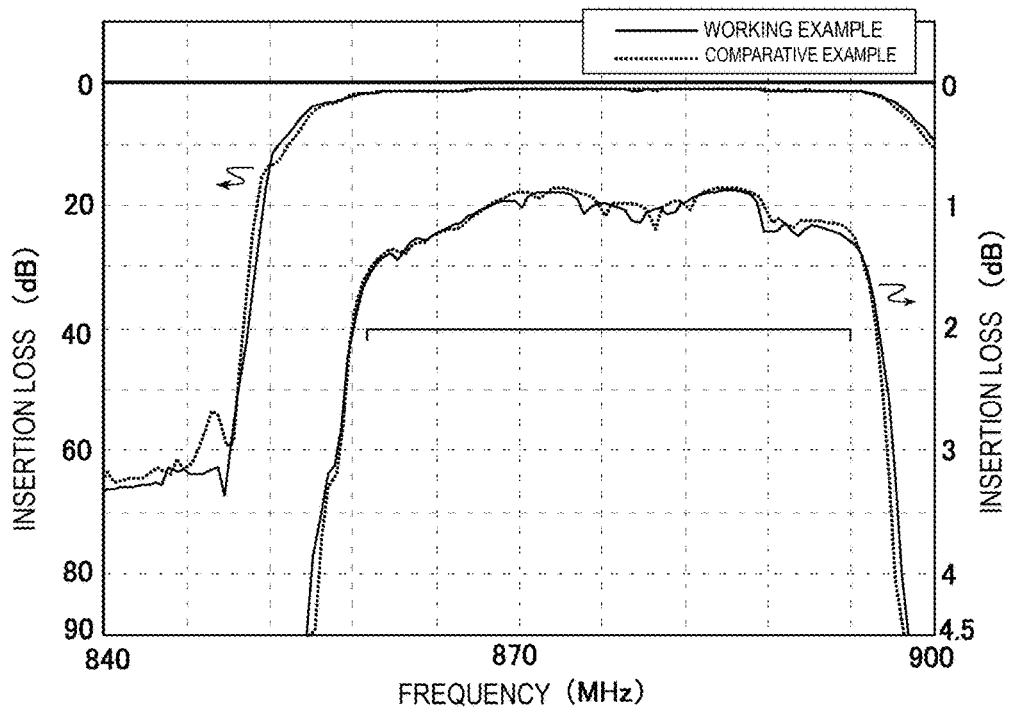

MULTIPLEXER

CROSS REFERENCE TO RELATED APPLICATIONS

This application claims the benefit of priority to Japanese Patent Application No. 2020-164877 filed on Sep. 30, 2020 and is a Continuation Application of PCT Application No. PCT/JP2021/035266 filed on Sep. 27, 2021. The entire contents of each application are hereby incorporated herein by reference.

BACKGROUND OF THE INVENTION

1. Field of the Invention

The present invention relates to multiplexers each including a filter that includes a longitudinally coupled acoustic wave resonator.

2. Description of the Related Art

In general, a multiplexer including a plurality of filters is known in the art. As an example of such type of multiplexers, International Publication No. 2010/035372 discloses a multiplexer including a filter that includes a longitudinally coupled acoustic wave resonator. In this multiplexer, a first order resonant mode is generated by configuring the longitudinally coupled acoustic wave resonator in such a manner as to have an asymmetric structure, and the steepness in a lower frequency range below a pass band is improved by using this first order resonant mode.

SUMMARY OF THE INVENTION

For example, in the case where, of the plurality of filters, one of the filters includes the foregoing longitudinally coupled acoustic wave resonator and another filter has a pass band that is lower in frequency than a pass band of the one of the filters, the insertion loss in the pass band of the another filter may degrade due to the first order resonant mode generated in the longitudinally coupled acoustic wave resonator in some cases.

Preferred embodiments of the present invention provide multiplexers each including first and second filters and preventing or reducing degradation of insertion loss in a pass band of the second filter.

A multiplexer according to one aspect of a preferred embodiment of the present invention includes a common terminal, a first terminal, and a second terminal, a first filter provided in a first path connecting the common terminal and the first terminal, a pass band of the first filter being a first frequency band, and a second filter in a second path connecting the common terminal and the second terminal, a pass band of the second filter being a frequency band in a lower frequency range below the first frequency band. The first filter includes a longitudinally coupled acoustic wave resonator including an interdigital transducer electrode group including a plurality of interdigital transducer electrodes along an acoustic wave propagation direction and having an asymmetric shape with respect to a center line that passes through a center of the interdigital transducer electrode group and is perpendicular or substantially perpendicular to the acoustic wave propagation direction, and of the plurality of interdigital transducer electrodes, an aggregate average of electrode finger pitches of the interdigital transducer electrodes connected to the first path on a common terminal side when seen from the longitudinally coupled acoustic wave resonator is smaller than an aggregate average of electrode finger pitches of the interdigital transducer electrodes connected to the first path on a first terminal side, and a sum of numbers of pairs of electrode fingers of the interdigital transducer electrodes connected to the first path on the common terminal side is less than a sum of numbers of pairs of electrode fingers of the interdigital transducer electrodes connected to the first path on the first terminal side.

According to preferred embodiments of the present invention, in multiplexers including first and second filters, degradation of insertion loss in a pass band of the second filter is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B are diagrams indicating electrode finger pitches and numbers of pairs of electrode fingers of interdigital transducer electrodes of an longitudinally coupled acoustic wave resonator of a working example, which is one example of a preferred embodiment of the present invention.

FIGS. 7A and 7B are diagrams indicating the electrode finger pitches and the numbers of pairs of electrode fingers of interdigital transducer electrodes of the longitudinally coupled acoustic wave resonator of the comparative example.

FIG. 8 is a diagram illustrating bandpass characteristics of the first filters in the working example and the comparative example.

DETAILED DESCRIPTION OF THE PREFERRED EMBODIMENTS

Figure 1:
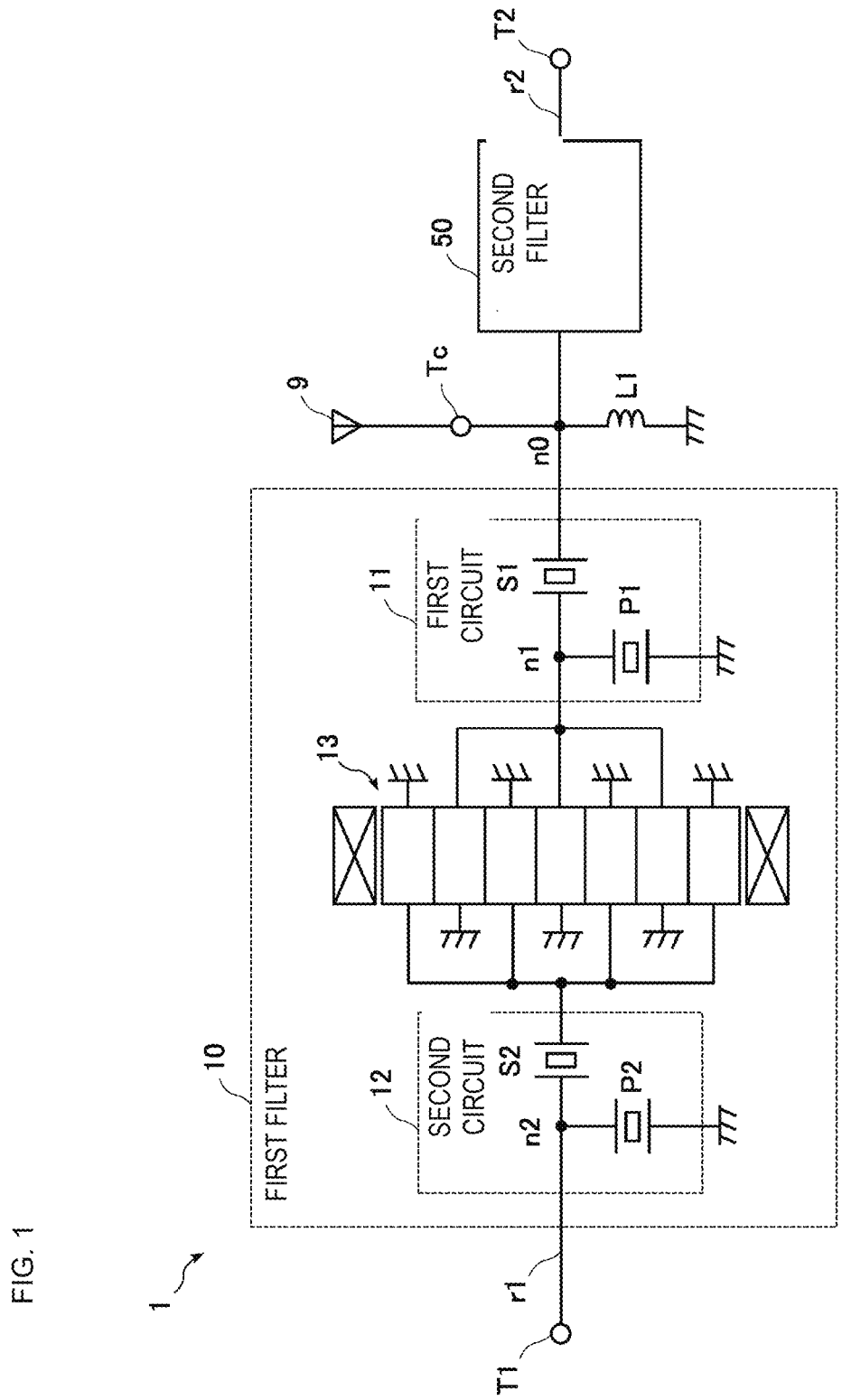
FIG. 1 is a circuit configuration diagram of a multiplexer according to a preferred embodiment of the present invention.

Hereinafter, preferred embodiments of the present invention will be described in detail with reference to the drawings. Note that preferred embodiments, which will be described below, each illustrate a comprehensive or specific example. Numeric values, shapes, materials, elements, arrangements and connection modes of the elements, and the like illustrated in the following preferred embodiments are mere examples, and not intended to limit the present invention. Of the elements in the following preferred embodiments, the elements that are not described in an independent claim will be described as optional elements. Further, sizes or ratios of the sizes of elements illustrated in the drawings are not necessarily exact ones. Further, in the respective drawings, same reference characters are attached to substantially the same elements, and in some cases, overlapping descriptions are omitted or simplified. Further, in the following preferred embodiments, the term "connect" is defined to include not only the case where elements are connected directly but also the case where elements are electrically connected via another element or the like.

Preferred Embodiment

1. Configuration of Multiplexer

A basic configuration of a multiplexer according to a preferred embodiment is described with reference to FIG. 1.

FIG. 1 is a circuit configuration diagram of a multiplexer 1 according to the present preferred embodiment. Note that FIG. 1 also illustrates an antenna element 9.

The multiplexer 1 is a multiplexer or a demultiplexer that includes a plurality of filters. The multiplexer 1 includes a first filter 10 which is one of the plurality of filters and a second filter 50 which is another of the plurality of filters. The first filter 10 is a filter whose pass band is a first frequency band. The second filter 50 is a filter whose pass band is a frequency band in a lower frequency range below the first frequency band.

In addition to the first filter 10 and the second filter 50, the multiplexer 1 includes a common terminal Tc, a first terminal T1, and a second terminal T2.

A common terminal Tc is a common terminal to which both the first filter 10 and the second filter 50 are connected. Specifically, the common terminal Ic is connected to one end portion of the first filter 10 via a node no between the common terminal Tc and the first filter 10, and to one end portion of the second filter 50 via the node n0. Further, the common terminal Tc is connected to the antenna element 9 at the outside of the multiplexer 1. The common terminal Tc also defines and functions as an antenna terminal of the multiplexer 1. An inductor L1 to perform matching is connected between the node n0 and ground.

The first terminal T1 is connected to the other end portion of the first filter 10. Further, the first terminal T1 is an input/output terminal which is to be connected to a RF signal processing circuit (not illustrated) via an amplifier circuit or the like (not illustrated) at the outside of the multiplexer 1.

The second terminal T2 is connected to the other end portion of the second filter 50. Further, the second terminal T2 is an input/output terminal which is to be connected to the RF signal processing circuit (not illustrated) via an amplifier circuit or the like (not illustrated) at the outside of the multiplexer 1.

The first filter 10 is arranged in a first path r1 connecting the common terminal Tc and the first terminal T1. The first filter 10 is, for example, a reception filter whose pass band is a downlink frequency band (reception band), and is set in such a manner as to have a pass band higher in frequency than the second filter 50.

The second filter 50 is arranged in a second path r2 connecting the common terminal Tc and the second terminal T2. The second filter 50 is, for example, a transmission filter whose pass band is an uplink frequency band (transmission band). For each of the first filter 10 and the second filter 50, it is required to have a characteristic that allows a signal of its own frequency band to pass and attenuates a signal of the other filter's frequency band that is outside its own frequency band.

The first filter 10 includes a first circuit 11, a longitudinally coupled acoustic wave resonator 13, and a second circuit 12. The first circuit 11, the longitudinally coupled acoustic wave resonator 13, and the second circuit 12 are connected in series in this order along the direction from the common terminal Tc to the first terminal T1.

The first circuit 11 is a band pass filter and includes a series arm resonator S1 and a parallel arm resonator P1, which are acoustic wave resonators. The series arm resonator S1 is arranged in the first path r1 between the common terminal Ic and the longitudinally coupled acoustic wave resonator 13, and is connected to one end portion of the longitudinally coupled acoustic wave resonator 13. In the first path r1, the series arm resonator S1 is provided closer to the common terminal Tc than the parallel arm resonator P1. The parallel arm resonator P1 is connected in a path that connects a reference terminal (ground) and a node n1, which is in the first path r1 between the series arm resonator S1 and the longitudinally coupled acoustic wave resonator 13. Specifically, the parallel arm resonator P1 is connected to the node n1 at one end portion and to the reference terminal at the other end portion. Note that the parallel arm resonator P1 also defines and functions as a matching element that provides matching between the longitudinally coupled acoustic wave resonator 13 and the series arm resonator S1.

The second circuit 12 is a band pass filter and includes a series arm resonator S2 and a parallel arm resonator P2, which are acoustic wave resonators. The series arm resonator S2 is arranged in the first path r1 between the longitudinally coupled acoustic wave resonator 13 and the first terminal T1, and is connected to the other end portion of the longitudinally coupled acoustic wave resonator 13. In the first path r1, the series arm resonator S2 is provided closer to the longitudinally coupled acoustic wave resonator 13 than the parallel arm resonator P2. The parallel arm resonator P2 is connected in a path that connects the reference terminal (ground) and a node n2, which is in the first path r1 between the series arm resonator S2 and the first terminal T1. Specifically, the parallel arm resonator P2 is connected to the node n2 at one end portion and to the reference terminal at the other end portion.

Note that each of the first circuit 11 and the second circuit 12 is not limited to have a single series arm resonator and a single parallel arm resonator, and may include two or more series arm resonators and two or more parallel arm resonators. Further, an inductor may be provided between the parallel arm resonator and the reference terminal.

Figure 2:
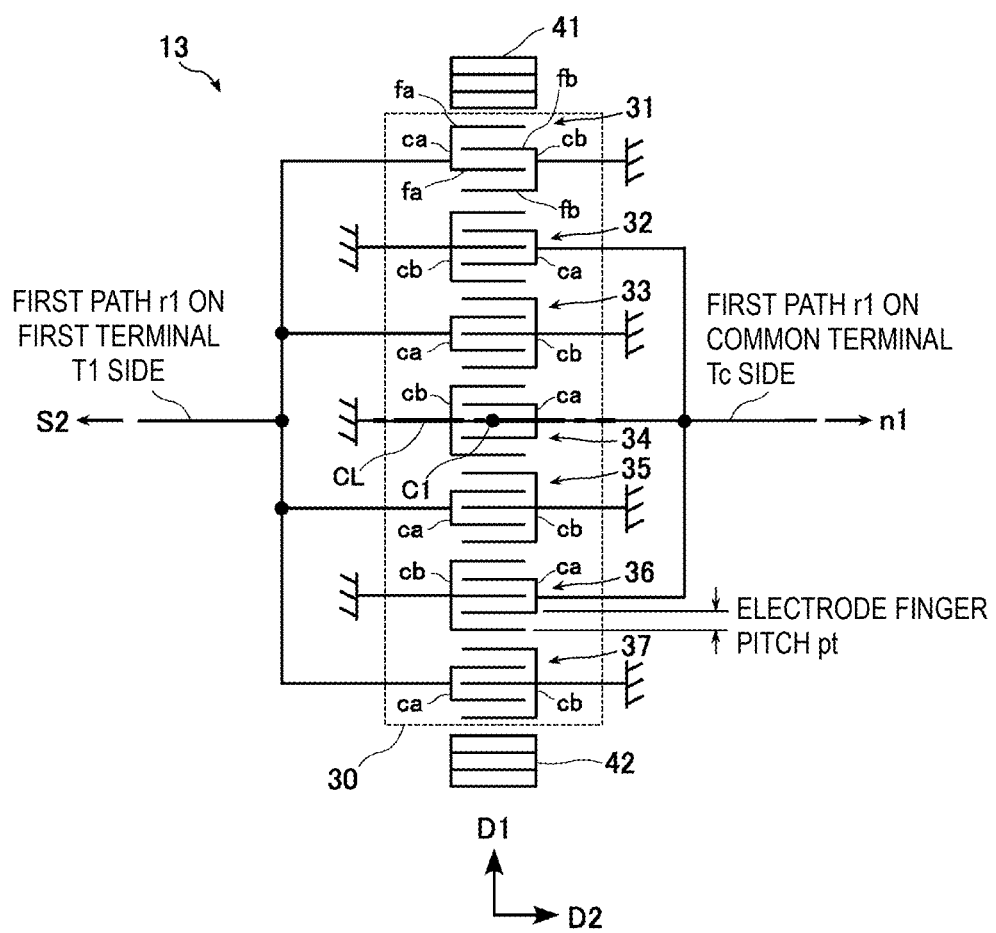
FIG. 2 is a schematic diagram illustrating a longitudinally coupled acoustic wave resonator of a first filter included in a multiplexer according to a preferred embodiment of the present invention.

FIG. 2 is a schematic diagram illustrating the longitudinally coupled acoustic wave resonator 13 of the first filter 10 included in the multiplexer 1. Note that in FIG. 2, the solid line denotes electrodes and wiring lines.

The longitudinally coupled acoustic wave resonator 13 includes a plurality of surface acoustic wave (SAW) resonators. The surface acoustic wave resonator includes a substrate 320, which will be described below, and IDT (interdigital transducer) electrodes provided on the substrate 320.

The longitudinally coupled acoustic wave resonator 13 includes an interdigital transducer electrode group 30 including a plurality of interdigital transducer electrodes arranged along an acoustic wave propagation direction D1. The interdigital transducer electrode group 30 of the present preferred embodiment includes seven interdigital transducer electrodes 31, 32, 33, 34, 35, 36, and 37, including an odd number of interdigital transducer electrodes. Further, the longitudinally coupled acoustic wave resonator 13 includes a plurality of reflectors 41 and 42. The plurality of reflectors 41 and 42 are arranged on both outer sides of the interdigital transducer electrode group 30 in the acoustic wave propagation direction D1 in such a way that the interdigital transducer electrode group 30 is sandwiched between the plurality of reflectors 41 and 42.

Each of the interdigital transducer electrodes 31 to 37 includes a pair of a first comb-shaped electrode ca and a second comb-shaped electrode cb, which face each other. The first comb-shaped electrode ca has a comb shape and includes a plurality of electrode fingers fa that are arranged in parallel or substantially in parallel to each other and a busbar electrode that connects respective end portions of the plurality of electrode fingers fa. The second comb-shaped electrode cb has a comb shape and includes a plurality of electrode fingers fb that are arranged in parallel or substantially in parallel to each other and a busbar electrode that connects respective end portions of the plurality of electrode fingers fb. Each of the busbar electrodes is formed in such a manner as to extend along the acoustic wave propagation direction D1. The electrode finger fa and the electrode finger fb are formed in such a manner as to extend in a perpendicular or substantially perpendicular direction D2 to the acoustic wave propagation direction D1, interdigitate each other in the orthogonal direction D2, and face each other in the acoustic wave propagation direction D1.

The plurality of interdigital transducer electrodes 31 to 37, which is the interdigital transducer electrode group 30, has an asymmetric shape with respect to a center line CL that passes through a center C1 of the interdigital transducer electrode group 30 and is perpendicular or substantially perpendicular to the acoustic wave propagation direction D1. The center C1 of the interdigital transducer electrode group 30 is the position at the midpoint of an intersecting width in the perpendicular or substantially perpendicular direction D2 and at the midpoint between the electrode fingers arranged at both distal ends of the electrode fingers fa and fb included in the interdigital transducer electrode group 30 in the acoustic wave propagation direction D1. This asymmetric structure is achieved by varying an electrode parameter or electrode parameters in each of the interdigital transducer electrodes 31 to 37 with respect to the center line CL.

For example, this asymmetric structure is achieved by varying at least one of the average pitch of the plurality of electrode fingers fa and fb of the interdigital transducer electrode, the number of pairs of electrode fingers thereof, and the duty thereof.

Note that the pitch is the distance between the centers of the electrode fingers fa and fb that are arranged next to each other in the acoustic wave propagation direction D1. Further, the average pitch is the value obtained by dividing the sum of all the pitches in an interdigital transducer electrode in question by (number of electrode fingers-1). For the interdigital transducer electrode including a plurality (three or more) of electrode fingers, the average pitch can be derived in the following manner. For example, in the interdigital transducer electrode 37, the average pitch can be derived by dividing the distance between the centers of the electrode fingers at one end and the other end of the interdigital transducer electrode 37 in the acoustic wave propagation direction D1 by the "number of electrode fingers included in the interdigital transducer electrode 37-1". Note that, for example, in the case where the "gap between electrode fingers" (see FIG. 3) is the gap between the electrode fingers fa and fb of the interdigital transducer electrode and are arranged next to each other, the "number of electrode fingers included in the interdigital transducer electrode 37-1" means the "number of the gaps between electrode fingers".

The number of pairs of electrode fingers and the number of electrode fingers have the relationship such that "the number of electrode fingers=the number of pairs of electrode fingers×2+1". For example, when the number of pairs of electrode fingers is 7 pairs, the number of electrode fingers is 15, and when the number of pairs of electrode fingers is 10 pairs, the number of electrode fingers is 21. Note that in the case where the number of electrode fingers is an even number, the number of pairs of electrode fingers is expressed using a decimal point number 0.5. For example, when the number of pairs of electrode fingers is 6.5 pairs, the number of electrode fingers is 14, and when the number of pairs of electrode fingers is 9.5 pairs, the number of electrode fingers is 20.

In the interdigital transducer electrode group 30 of the present preferred embodiment, on two sides of the center line CL in the acoustic wave propagation direction D1, which are two areas divided with respect to the center line CL, both the average pitch of the electrode fingers fa and fb and the number of pairs of electrode fingers are varied area by area. Note that in some cases, the center line CL is not on the electrode finger fa or fb.

For example, in the interdigital transducer electrode group 30, when the interdigital transducer electrode 34, which is positioned at the center in the acoustic wave propagation direction D1, is used as a reference, the interdigital transducer electrodes 31, 32, and 33 positioned in one side in the acoustic wave propagation direction D1 and the interdigital transducer electrodes 35, 36, and 37 positioned in the other side in the acoustic wave propagation direction D1 are different from each other in both the average pitch and the number of pairs of electrode fingers. Specifically, the interdigital transducer electrode 33 and the interdigital transducer electrode 35 are different from each other in the average pitch and the number of pairs of electrode fingers, the interdigital transducer electrode 32 and the interdigital transducer electrode 36 are different from each other in the average pitch and the number of pairs of electrode fingers, and the interdigital transducer electrode 31 and the interdigital transducer electrode 37 are different from each other in the average pitch and the number of pairs of electrode fingers.

Further, the interdigital transducer electrodes 31, 33, 35, and 37 are connected to the first path r1 on the first terminal T1 side when seen from the longitudinally coupled acoustic wave resonator 13. Specifically, all of the first comb-shaped electrodes ca of the interdigital transducer electrodes 31, 33, 35, and 37 are connected to the second circuit 12 in the first path r1 after being extracted by lead lines and connected together. The second comb-shaped electrodes cb of the interdigital transducer electrodes 31, 33, 35, and 37 are extracted by lead lines and connected to the ground (for example, an electrode for ground).

On the other hand, the interdigital transducer electrodes 32, 34, and 36 are connected to the first path r1 on the common terminal Tc side when seen from the longitudinally coupled acoustic wave resonator 13. Specifically, all of the first comb-shaped electrodes ca of the interdigital transducer electrodes 32, 34, and 36 are connected to the first circuit 11 in the first path r1 after being extracted by lead lines and connected together. The second comb-shaped electrodes cb of the interdigital transducer electrodes 32, 34, and 36 are extracted by lead lines and connected to the ground. When seen from the longitudinally coupled acoustic wave resonator 13, the number of the interdigital transducer electrodes connected to the first path r1 on the common terminal Tc side is less than the number of the interdigital transducer electrodes connected to the first path r1 on the first terminal T1 side.

In the present preferred embodiment, of the plurality of the interdigital transducer electrodes 31 to 37, the interdigital transducer electrodes 32, 34, and 36, which are connected to the first path r1 on the common terminal Tc side when seen from the longitudinally coupled acoustic wave resonator 13, have a smaller aggregate average of the electrode finger pitches of the interdigital transducer electrodes and a smaller sum of the numbers of pairs of electrode fingers, compared with the interdigital transducer electrodes 31, 33, 35, and 37, which are connected to the first path r1 on the first terminal T1 side. Note that the electrode finger pitch is the distance between the centers of the electrode fingers fa and fb that are arranged next to each other in the acoustic wave propagation direction D1. Further, the aggregate average of the electrode finger pitches can be derived by dividing the total of center-to-center distances of all the interdigital transducer electrodes 31 to 37, the center-to-center distance being the distance between the centers of the electrode fingers at one end and the other end of the interdigital transducer electrode in question, by the total of the numbers of the gaps between electrode fingers (see FIG. 3) of all the interdigital transducer electrodes 31 to 37.

2. Structure of Interdigital Transducer Electrodes of Longitudinally Coupled Acoustic Wave Resonator Next, a structure of the interdigital transducer electrodes of the longitudinally coupled acoustic wave resonator 13 is described.

Figure 3:
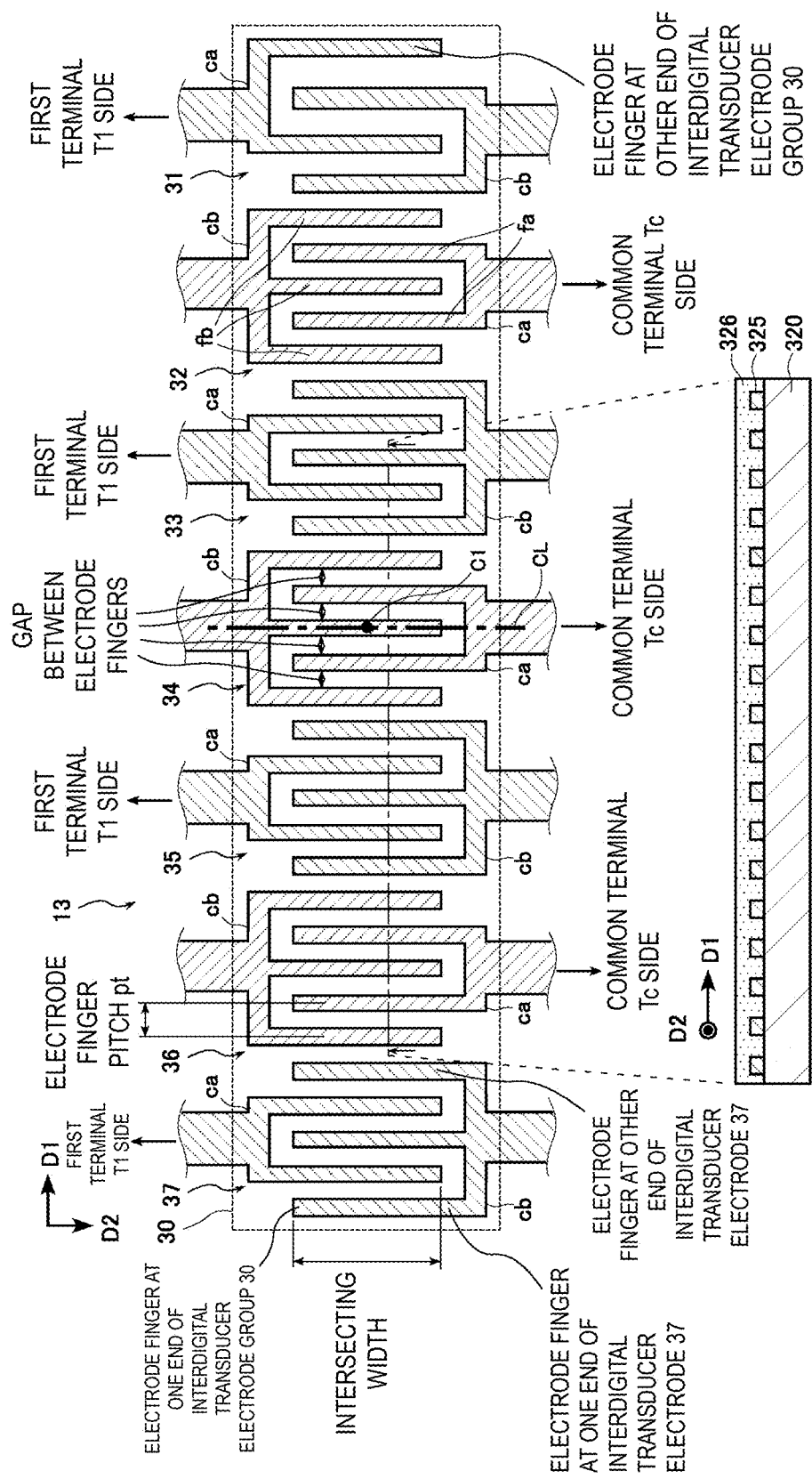
FIG. 3 shows a plan view and a cross-sectional view schematically illustrating a structure of interdigital transducer electrodes of the longitudinally coupled acoustic wave resonator illustrated in FIG. 2.

FIG. 3 shows a plan view and a cross-sectional view schematically illustrating a structure of the interdigital transducer electrodes 31 to 37 of the longitudinally coupled acoustic wave resonator 13. This drawing is provided to simplify the structure of the interdigital transducer electrodes for illustration, and the number of and the lengths of the electrode fingers included in the interdigital transducer electrodes and the like are different from FIG. 3.

The longitudinally coupled acoustic wave resonator 13 includes a substrate 320 having piezoelectricity, an electrode layer 325 provided on the substrate 320 and defining the respective interdigital transducer electrodes 31 to 37, and a dielectric layer 326 provided on the substrate 320 in such a manner as to cover the respective interdigital transducer electrode 31 to 37.

The substrate 320 is, for example, a $LiNbO_3$ substrate (lithium niobite substrate) with a cut angle of 127.5°. In the case where a Rayleigh wave is used as an acoustic wave that propagates through the substrate 320, it is desirable that the cut angle of the substrate 320 is about 120°+20° or about 300°+20°, for example.

The electrode layer 325 has the structure in which a plurality of metal layers are stacked on top of each other. For example, the electrode layer 325 is formed by stacking a Ti layer, an Al layer, a Ti layer, a Pt layer, and a NiCr layer in sequence from the top.

The dielectric layer 326 is, for example, a film whose main component is silicon dioxide ($SiO_2$). The dielectric layer 326 is provided to adjust the frequency-temperature characteristic of the interdigital transducer electrodes 31 to 37, for protecting the electrode layer 325 against the external environment, or for increasing the moisture resistance.

FIGS. 4A and 4B are diagrams indicating the electrode finger pitches pt of the electrode fingers fa and fb and the numbers of pairs of electrode fingers pn of the interdigital transducer electrodes 31 to 37 of the longitudinally coupled acoustic wave resonator 13 of a working example, which is one example of the present preferred embodiment.

In FIG. 4A, the average pitches of the electrode fingers fa and fb and the numbers of pairs of electrode fingers pn of the respective interdigital transducer electrodes 31 to 37 are illustrated. As illustrated in FIG. 4A, of the interdigital transducer electrodes 31 to 37, the interdigital transducer electrode 31 to 33 are different from the interdigital transducer electrodes 35 to 37 in the average pitch and the number of pairs of electrode fingers pn when the interdigital transducer electrode 34 (or the center line CL) at the center is used as a reference, and thus the interdigital transducer electrodes 31 to 37 form an asymmetric shape.

In FIG. 4B, the aggregate average of the electrode finger pitches pt and the sum of the numbers of pairs of electrode fingers pn of the interdigital transducer electrodes 32, 34, and 36 and the aggregate average of the electrode finger pitches pt and the sum of the numbers of pairs of electrode fingers pn of the interdigital transducer electrodes 31, 33, 35, and 37 are illustrated. As illustrated in FIG. 4B, the interdigital transducer electrodes 32, 34, and 36, which are connected to the first path r1 on the common terminal Tc side when seen from the longitudinally coupled acoustic wave resonator 13, have a smaller aggregate average of the electrode finger pitches pt and a smaller sum of the numbers of pairs of electrode fingers pn, compared with the interdigital transducer electrodes 31, 33, 35, and 37, which are connected to the first path r1 on the first terminal T1 side. Note that the intersecting widths of the interdigital transducer electrodes 31 to 37 are all the same, and the duties of the interdigital transducer electrodes 31 to 37 are all the same.

3. Comparison between Working Example and Comparative Example

The multiplexer 1 of the working example having the configuration described above is described while comparing with the comparative example.

Figure 5:
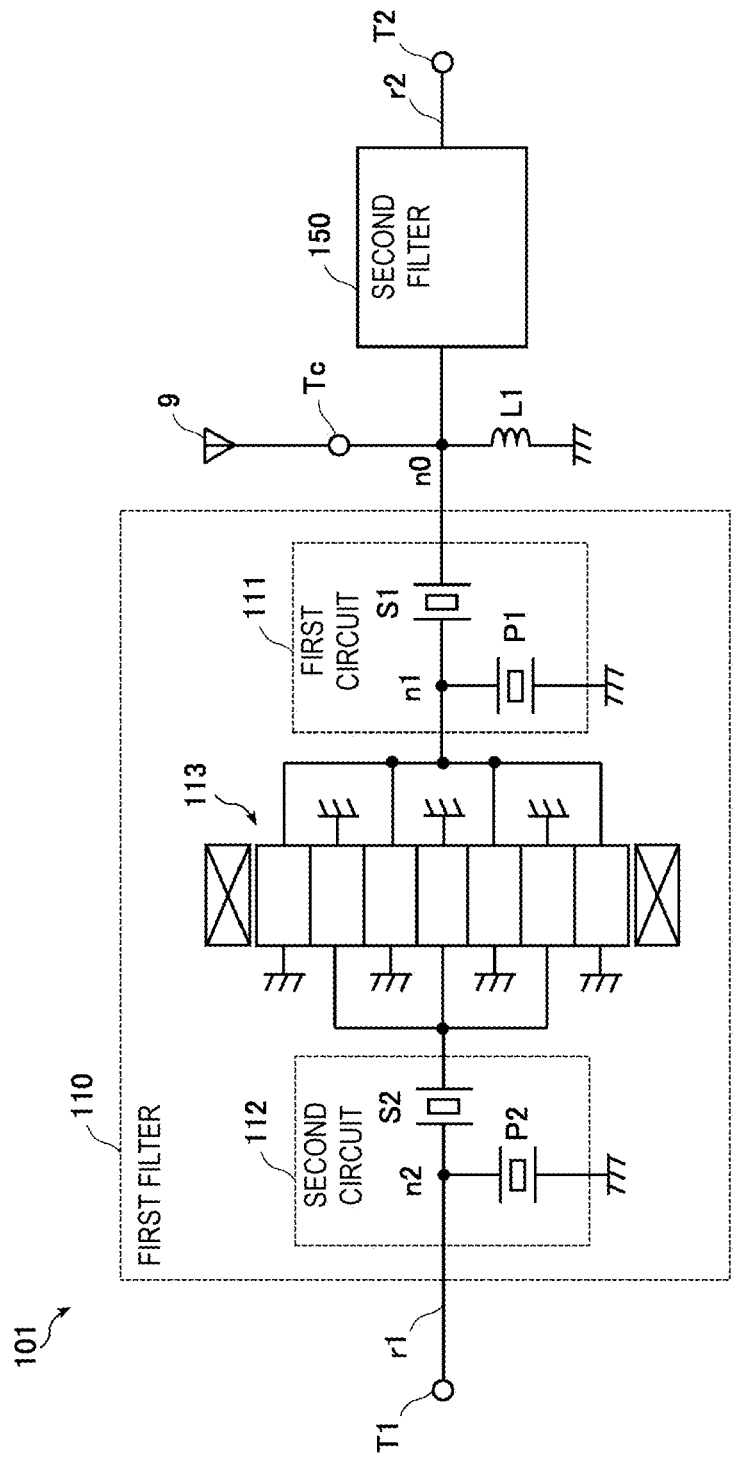
FIG. 5 is a circuit configuration diagram of a multiplexer of a comparative example.

FIG. 5 is a circuit configuration diagram of a multiplexer 101 of a comparative example. The multiplexer 101 of the comparative example includes a first filter 110 and a second filter 150. Further, the first filter 110 of the comparative example includes a first circuit 111, a longitudinally coupled acoustic wave resonator 113, and a second circuit 112. Note that the longitudinally coupled acoustic wave resonator 113 of the comparative example is different from the longitudinally coupled acoustic wave resonator 13 of the working example in configuration.

Figure 6:
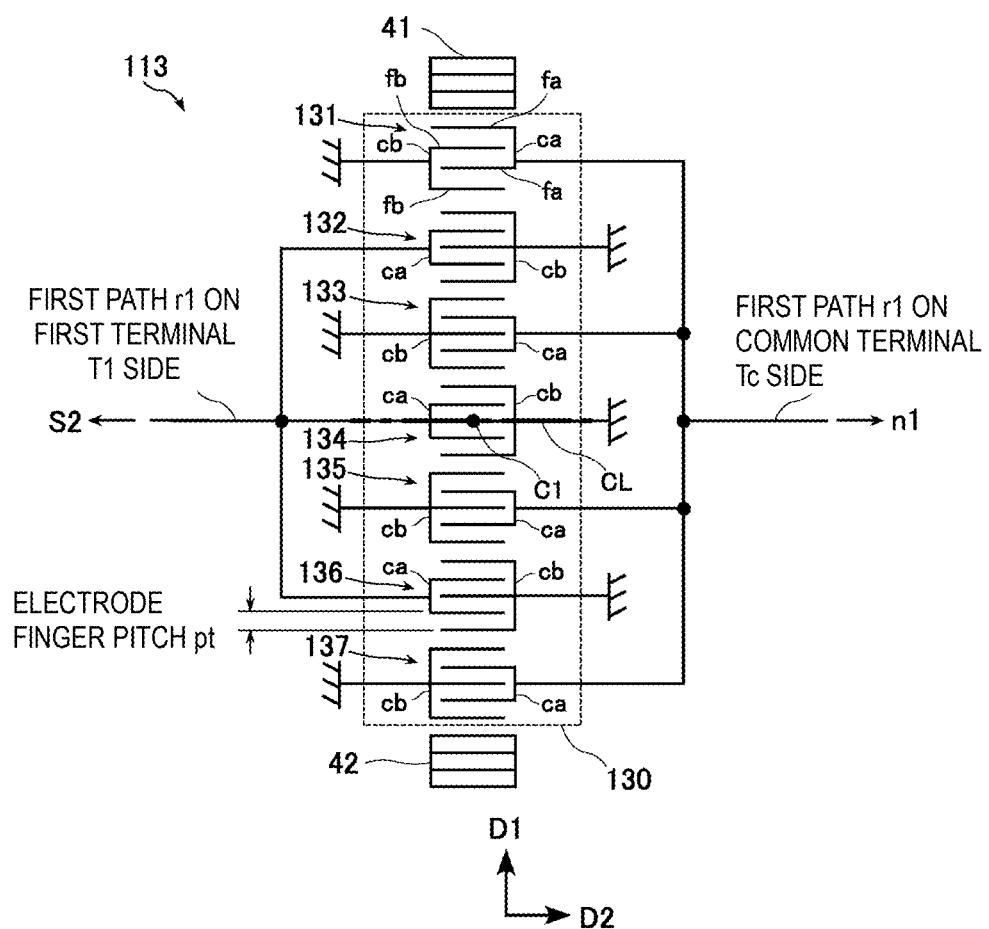
FIG. 6 is a schematic diagram illustrating a longitudinally coupled acoustic wave resonator of a first filter included in the multiplexer of the comparative example.

FIG. 6 is a schematic diagram illustrating the longitudinally coupled acoustic wave resonator 113 of the first filter 110 included in the multiplexer 101 of the comparative example. The longitudinally coupled acoustic wave resonator 113 of the comparative example includes an interdigital transducer electrode group 130 including a plurality of interdigital transducer electrodes arranged along the acoustic wave propagation direction D1. The interdigital transducer electrode group 130 of the comparative example includes a plurality of interdigital transducer electrodes 131, 132, 133, 134, 135, 136, and 137. Further, the longitudinally coupled acoustic wave resonator 113 includes a plurality of reflectors 141 and 142.

The interdigital transducer electrodes 132, 134, and 136 of the comparative example are connected to the first path r1 on the first terminal T1 side when seen from the longitudinally coupled acoustic wave resonator 113. On the other hand, the interdigital transducer electrodes 131, 133, 135, and 137 are connected to the first path r1 on the common terminal Tc side when seen from the longitudinally coupled acoustic wave resonator 113. When seen from the longitudinally coupled acoustic wave resonator 113, the number of the interdigital transducer electrodes connected to the first path r1 on the common terminal Tc side is greater than the number of the interdigital transducer electrodes connected to the first path r1 on the first terminal T1 side.

FIGS. 7A and 7B are diagrams indicating the electrode finger pitches pt and the numbers of pairs of electrode fingers pn of the interdigital transducer electrodes 131 to 137 of the longitudinally coupled acoustic wave resonator 113 of the comparative example.

In FIG. 7A, the average pitches of the electrode fingers fa and fb and the numbers of pairs of electrode fingers pn of the respective interdigital transducer electrodes 131 to 137 are illustrated. As illustrated in FIG. 7A, of the interdigital transducer electrodes 131 to 137, the interdigital transducer electrode 131 to 133 are different from the interdigital transducer electrodes 135 to 137 in the average pitch and the number of pairs of electrode fingers pn when the interdigital transducer electrode 134 (or the center line CL) at the center is used as a reference, and thus the interdigital transducer electrodes 131 to 137 form an asymmetric shape.

In FIG. 7B, the aggregate average of the electrode finger pitches pt and the sum of the numbers of pairs of electrode fingers pn of the interdigital transducer electrodes 132, 134, and 136 and the aggregate average of the electrode finger pitches pt and the sum of the numbers of pairs of electrode fingers pn of the interdigital transducer electrodes 131, 133, 135, and 137 are illustrated. As illustrated in FIG. 7B, the interdigital transducer electrodes 131, 133, 135, and 137, which are connected to the first path r1 on the common terminal Tc side when seen from the longitudinally coupled acoustic wave resonator 113 of the comparative example, have a larger aggregate average of the electrode finger pitches pt and a larger sum of the numbers of pairs of electrode fingers pn, compared with the interdigital transducer electrodes 132, 134, and 136, which are connected to the first path r1 on the first terminal T1 side.

That is to say, in the comparative example, the interdigital transducer electrodes 131, 133, 135, and 137 connected to the common terminal Tc side have a larger aggregate average of the electrode finger pitches pt and a larger sum of the numbers of pairs of electrode fingers pn, compared with the interdigital transducer electrodes 132, 134, and 136 connected to the first terminal T1 side. In contrast, in the working example, the interdigital transducer electrodes 32, 34, and 36 connected to the common terminal Tc side have a smaller aggregate average of the electrode finger pitches pt and a smaller sum of the numbers of pairs of electrode fingers pn, compared with the interdigital transducer electrodes 31, 33, 35, and 37 connected to the first terminal T1 side.

Figure 9:
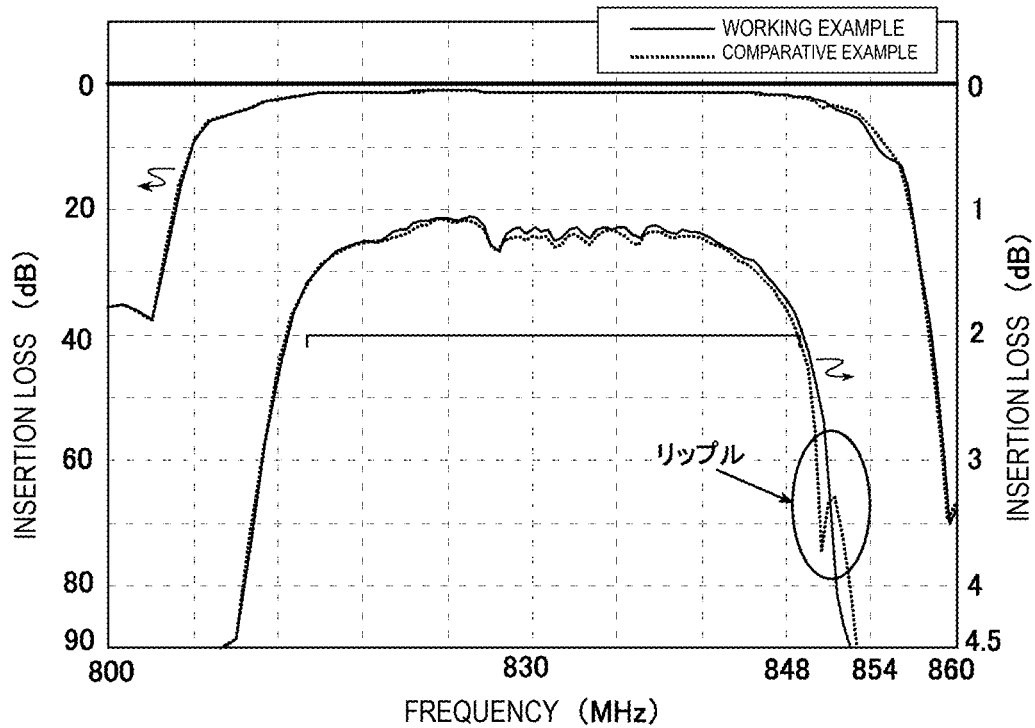
FIG. 9 is a diagram illustrating bandpass characteristics of second filters in the working example and the comparative example.

FIG. 8 is a diagram illustrating the bandpass characteristics of the first filters 10 and 110 in the working example and the comparative example. FIG. 9 is a diagram illustrating the bandpass characteristics of the second filters 50 and 150 in the working example and the comparative example. FIG. 8 and FIG. 9 illustrate examples in which Band 26 is the corresponding band of the multiplexer 1. Specifically, FIG. 8 and FIG. 9 illustrate the examples in which the pass bands of the first filters 10 and 110 are between about 859 MHz and about 894 MHZ, and the pass bands of the second filters 50 and 150 are between about 814 MHz and about 849 MHZ.

As illustrated in FIG. 8, in both the working example and the comparative example, the degradation of the insertion loss is small on the low frequency side of the pass band of each of the first filters 10 and 110. For example, at a frequency of about 859 MHz, the insertion losses of the working example and the comparative example are both about 1.62 dB.

However, as illustrated in FIG. 9, in the comparative example, a ripple appears around 851.4 MHZ, which is in a higher frequency range above the pass band of the second filter 150. Therefore, the insertion loss on the high frequency side of the pass band of the second filter 150 degrades. For example, the insertion loss at a frequency of about 849 MHz is about 2.05 dB.

In contrast, in the working example, no ripple appears around a frequency of about 851.4 MHZ, and a ripple appears, for example, at a frequency higher than an attenuation slope positioned in a higher frequency range above the pass band (illustration omitted). That is to say, in the working example, the degradation of the insertion loss is suppressed on the high frequency side of the pass band of the second filter 50 by moving the ripple to a higher frequency range. For example, the insertion loss at a frequency of about 849 MHz is about 1.94 dB.

Here, the difference in the insertion loss between the second filters 50 and 150 caused by the difference in the configuration between the first filter 10 and 110 is described.

Figure 10:
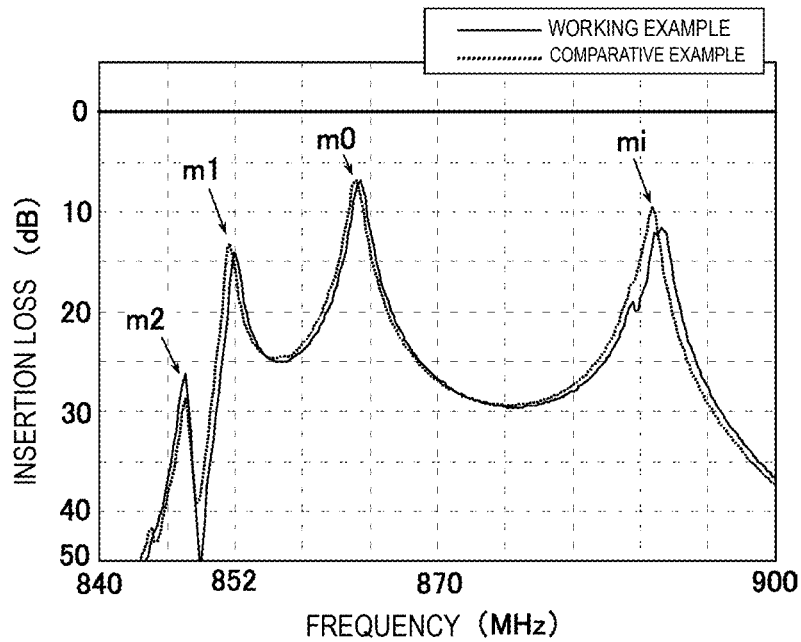
FIG. 10 is a diagram illustrating resonant modes of the longitudinally coupled acoustic wave resonators alone in the working example and the comparative example.

FIG. 10 is a diagram illustrating resonant modes of the longitudinally coupled acoustic wave resonators alone in the working example and the comparative example. FIG. 10 illustrates, as the resonant modes generated by the respective longitudinally coupled acoustic wave resonators 13 and 113, a second order resonant mode m2, a first order resonant mode m1, a zeroth order resonant mode m0, and a resonant mode mi between interdigital transducers. These resonant modes are generated because of an electric current distribution generated in the longitudinally coupled acoustic wave resonator.

The first order resonant mode m1 is generated because the plurality of interdigital transducer electrodes has an asymmetric shape in the acoustic wave propagation direction D1. In the working example and the comparative example, the steepness of the attenuation slopes positioned in lower frequency ranges below the pass bands of the first filters 10 and 110 is increased by forming an attenuation pole, which is generated at a resonant frequency of this first order resonant mode m1, in a frequency band between the pass band of the second filter and the pass band of the first filter.

However, in the comparative example, the ripple caused by the first order resonant mode m1 appears in the vicinity of the high frequency side of the pass band of the second filter 150 (see FIG. 9). Therefore, the insertion loss on the high frequency side of the pass band of the second filter 150 degrades.

In contrast, the first order resonant mode m1 of the working example is generated at a higher frequency than the first order resonant mode m1 of the comparative example. As illustrated in FIG. 10, whereas the first order resonant mode m1 of the comparative example is generated around a frequency of about 851.4 MHz, the first order resonant mode m1 of the working example is generated around a frequency of about 852.2 MHZ. Therefore, the ripple caused by the first order resonant mode m1 of the working example appears at a higher frequency than that of the comparative example. Because of this, compared with the comparative example, in the working example, the first order resonant mode m1 generated by the longitudinally coupled acoustic wave resonator 13 is less likely to cause undesirable effects on the pass band of the second filter 50.

Furthermore, the rerun losses that can be generated by the longitudinally coupled acoustic wave resonators 13 and 113 are described here.

Figure 11:
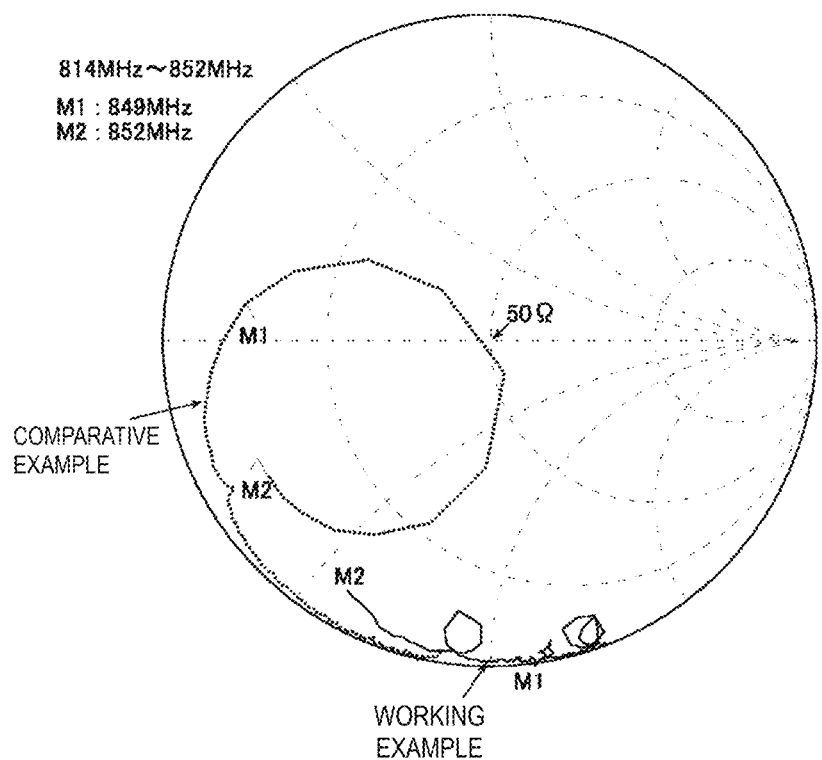
FIG. 11 is a diagram illustrating impedance characteristics of the longitudinally coupled acoustic wave resonators alone, which are seen from a common terminal side, in a frequency band that includes the pass bands of the second filters.

FIG. 11 is a diagram illustrating impedance characteristics of the longitudinally coupled acoustic wave resonators 13 and 113 alone, which are seen from the common terminal Tc side, in a frequency band that includes the pass bands of the second filters. FIG. 11 illustrates the impedance characteristics in the frequency range from about 814 MHz to about 852 MHZ, which includes frequency bands in which the first order resonant modes m1 are generated and the pass bands of the second filters 50 and 150. Note that in this drawing, a marker M1 denotes a position of about 849 MHz, and a marker M2 denotes a position of about 852 MHZ.

As illustrated in FIG. 11, in the comparative example, the impedance characteristic moves away from the perimeter circle of the Smith chart and moves closer to an inner-side reference impedance (for example, about 50Ω). This is because, in the comparative example, the interdigital transducer electrodes connected to the common terminal Tc side have a larger aggregate average of the electrode finger pitches pt and a larger sum of the numbers of pairs of electrode fingers pn than the interdigital transducer electrodes connected to the first terminal T1 side. Therefore, the resonant frequency of the first order resonant mode m1 becomes lower, and the ripple moves closer to the pass band of the second filter 150. Therefore, for example, around a frequency of about 851 MHz, the impedance of the longitudinally coupled acoustic wave resonator 113 becomes closer to the reference impedance, and the return loss of the longitudinally coupled acoustic wave resonator 113 seen from the common terminal Tc side becomes larger.

In contrast, in the working example, the impedance characteristic moves away from the reference impedance and toward the outer side, and is positioned near the perimeter circle. This is because, in the working example, the interdigital transducer electrodes connected to the common terminal Tc side have a smaller aggregate average of the electrode finger pitches pt and a smaller sum of the numbers of pairs of electrode fingers pn than the interdigital transducer electrodes connected to the first terminal T1 side. Therefore, the first order resonant mode m1 moves to a higher frequency range, and the ripple moves away from the pass band of the second filter 50 and toward a higher frequency range. Therefore, the impedance of the longitudinally coupled acoustic wave resonator 13 moves away from the reference impedance in a frequency range from about 849 MHz to about 852 MHZ, and the return loss of the longitudinally coupled acoustic wave resonator 13 seen from the common terminal Tc side becomes smaller. That is to say, the degradation of the insertion loss in the pass band of the second filter 50 is reduced or prevented.

At that time, even if only the aggregate average of the electrode finger pitches pt were made smaller, the resonant mode m1 would still move to a higher frequency range. However, impedance mismatching would also occur between the interdigital transducer electrodes 32, 34, and 36 connected to the common terminal Tc side and the interdigital transducer electrodes 31, 33, 35, and 37 connected to the first terminal T1 side, and the insertion loss in the pass band of the first filter 10 would degrade. Therefore, the sum of the numbers of pairs of electrode fingers pn is modified to reduce or prevent the degradation of the insertion loss.

Note that the numbers of pairs of electrode fingers pn of the interdigital transducer electrodes of the longitudinally coupled acoustic wave resonator 13 are determined by the band width of the pass band of the first filter 10. Therefore, although it is difficult to change the number of pairs of electrode fingers pn considerably, by increasing the number of pairs of electrode fingers pn on the first terminal T1 side while reducing the number of pairs of electrode fingers pn on the common terminal Tc side, it becomes possible to adjust the sum of the numbers of pairs of electrode fingers pn. Because of this, the degradation of the insertion loss in the pass band of the second filter 50 can be reduced or prevented without changing the band width of the pass band of the first filter 10 considerably.

Further, in the first filter 10 of the multiplexer 1, it is desirable that the parallel arm resonator P1 is connected closer to the common terminal Tc than the longitudinally coupled acoustic wave resonator 13.

Figure 12:
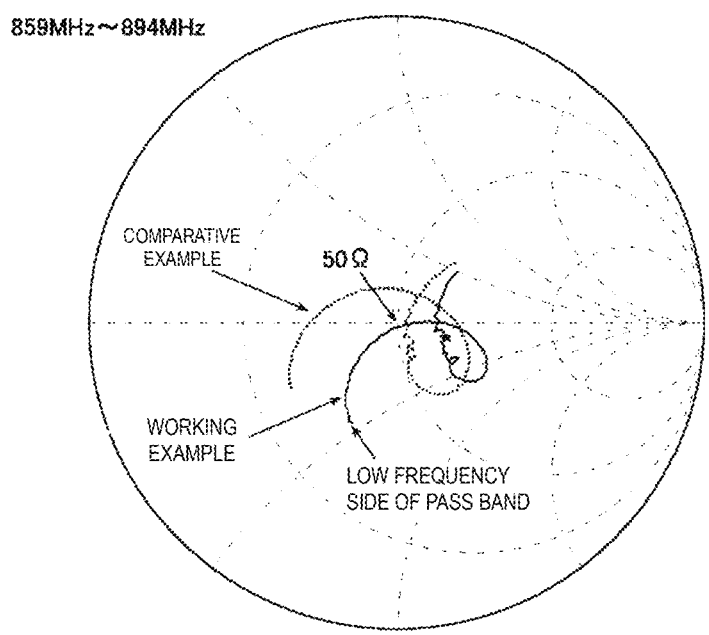
FIG. 12 is a diagram illustrating impedance characteristics of the longitudinally coupled acoustic wave resonators alone, which are seen from the common terminal side, in the pass bands of the first filters.

FIG. 12 is a diagram illustrating the impedance characteristics of the longitudinally coupled acoustic wave resonators 13 alone, which are seen from the common terminal Tc side, in the pass bands of the first filters 10. FIG. 12 illustrates the impedance characteristics in the range from about 859 MHz to about 894 MHZ, which corresponds to the pass bands of the first filters 10 and 110.

As illustrated in FIG. 12, when the longitudinally coupled acoustic wave resonator 13 of the working example is seen alone, the impedance characteristic toward the high impedance side compared with the comparative example, and the low frequency side of the pass band becomes more capacitive and is away from the reference impedance (about 50Ω). Therefore, for the longitudinally coupled acoustic wave resonator 13 alone, in the pass band of the first filter 10, the impedance of the longitudinally coupled acoustic wave resonator 13 increases, and it is likely to have the insertion loss.

In view of this, the impedance on the low frequency side of the pass band of the first filter 10 is moved closer to the reference impedance by connecting the parallel arm resonator P1 having inductive property to the longitudinally coupled acoustic wave resonator 13 on the common terminal Tc side. Because of this, the degradation of the insertion loss in the pass band of the first filter 10 can be reduced or prevented. Note that it is desirable that the parallel arm resonator P1 is directly connected to the longitudinally coupled acoustic wave resonator 13 without having any other acoustic wave resonator in between the parallel arm resonator P1 and the longitudinally coupled acoustic wave resonator 13.

Conclusion

As described above, the multiplexer 1 according to the present preferred embodiment includes the common terminal Tc, the first terminal T1, and the second terminal T2, the first filter 10 in the first path r1 connecting the common terminal Tc and the first terminal T1, the pass band of the first filter 10 being the first frequency band, and the second filter 50 provided in the second path r2 connecting the common terminal Tc and the second terminal T2, the pass band of the second filter 50 being a frequency band in a lower frequency range below the first frequency band. The first filter 10 includes the longitudinally coupled acoustic wave resonator 13. The longitudinally coupled acoustic wave resonator 13 includes the interdigital transducer electrode group 30 including a plurality of interdigital transducer electrodes 31 to 37 arranged along the acoustic wave propagation direction D1. The interdigital transducer electrode group 30 has an asymmetric shape with respect to the center line CL that passes through the center C1 of the interdigital transducer electrode group 30 and is perpendicular or substantially perpendicular to the acoustic wave propagation direction D1. Of the plurality of interdigital transducer electrodes 31 to 37, the aggregate average of the electrode finger pitches pt of the interdigital transducer electrodes 32, 34, and 36 connected to the first path r1 on the common terminal Tc side when seen from the longitudinally coupled acoustic wave resonator 13 is smaller than the aggregate average of the electrode finger pitches pt of the interdigital transducer electrodes 31, 33, 35, and 37 connected to the first path r1 on the first terminal T1 side, and the sum of numbers of pairs of electrode fingers pn of the interdigital transducer electrodes 32, 34, and 36 connected to the first path r1 on the common terminal Tc side is less than the sum of numbers of pairs of electrode fingers pn of the interdigital transducer electrodes 31, 33, 35, and 37 connected to the first path r1 on the first terminal T1 side.

As described above, because the plurality of interdigital transducer electrodes 31 to 37 has an asymmetric shape, the first order resonant mode m1 is generated. By using an attenuation pole formed by this first order resonant mode m1, the steepness in a lower frequency range below the pass band of the first filter 10 can be improved. Further, the first order resonant mode m1 can be moved to a higher frequency range by reducing the aggregate average of the electrode finger pitches pt of the electrode fingers fa and fb and further the sum of the numbers of pairs of electrode fingers pn of the interdigital transducer electrodes connected to the common terminal Tc side, compared with those of the interdigital transducer electrodes connected to the first terminal T1 side. Because of this, an impact of the first order resonant mode m1 on the pass band of the second filter 50 can be reduced. That is to say, in the multiplexer 1 including the first filter 10 and the second filter 50, the degradation of the insertion loss in the pass band of the second filter 50 can be suppressed.

Further, the interdigital transducer electrode group 30 may have the asymmetric shape described above by making at least one of the average pitch pt of the electrode fingers fa and fb and the number of pairs of electrode fingers pn of the interdigital transducer electrode different on two sides of the center line CL in the acoustic wave propagation direction D1.

As described above, with the achievement of an asymmetric shape by varying at least one of the average pitch of the electrode fingers fa and fb and the number of pairs of electrode fingers pn, the steepness in a lower frequency range below the pass band of the first filter 10 can be improved using an attenuation pole generated by the first order resonant mode m1.

Further, the interdigital transducer electrode group 30 may have the asymmetric shape described above by making both the average pitch of electrode fingers and the number of pairs of electrode fingers pn of the interdigital transducer electrode different on two sides of the center line CL in the acoustic wave propagation direction D1.

As described above, with the achievement of an asymmetric shape by varying both the average pitch of the electrode fingers fa and fb and the number of pairs of electrode fingers pn, the steepness in a lower frequency range below the pass band of the first filter 10 can be improved by appropriately using an attenuation pole generated by the first order resonant mode m1.

Further, the first filter 10 may include the parallel arm resonator P1 connected to the first path r1 in between the common terminal Tc and the longitudinally coupled acoustic wave resonator 13.

By connecting the parallel arm resonator P1 as described above, the impedance on the low frequency side of the pass band of the first filter 10 can be moved closer to the reference impedance. Because of this, the degradation of the insertion loss in the pass band of the first filter 10 can be reduced or prevented.

Further, the first filter 10 may include the parallel arm resonator P1 and the series arm resonator S1 that are connected to the first path r1 in between the common terminal Tc and the longitudinally coupled acoustic wave resonator 13, and in the first path r1, the series arm resonator S1 may be provided closer to the common terminal Tc than the parallel arm resonator P1.

Because of this, the impedance in the pass band of the first filter 10 can be increased, and the degradation of the insertion loss in the pass band of the second filter 50 can be reduced or prevented.

Further, the number of the plurality of interdigital transducer electrodes 31 to 37 may be an odd number, and the number of the interdigital transducer electrodes 32, 34, and 36 connected on the common terminal Tc side may be less than the number of the interdigital transducer electrodes 31, 33, 35, and 37 connected on the first terminal T1 side.

For example, the more the number of the interdigital transducer electrodes is, the larger the impact of the first order resonant mode m1 on the pass band of the second filter 50 becomes. However, because the multiplexer 1 has the configuration described above, it becomes possible to reduce or prevent the degradation of the insertion loss in the pass band of the second filter 50, and thus advantageous effects of preferred embodiments of the present invention can be suitably produced. Further, by increasing the number of the interdigital transducer electrodes of the longitudinally coupled acoustic wave resonator 13, particularly increasing to seven or more, for example, the intersecting width of the interdigital transducer electrodes can be reduced, and thus the steepness in a lower frequency range below the pass band of the first filter 10 can be improved. Further, it is also possible to reduce the sum of the numbers of pairs of electrode fingers pn by reducing the number of the interdigital transducer electrodes connected to the common terminal Tc side and to improve the steepness in a lower frequency range below the pass band of the first filter 10.

Further, the resonant frequency of the first order resonant mode m1 generated by the longitudinally coupled acoustic wave resonator 13 may be in a frequency band between the pass band of the second filter 50 and the pass band of the first filter 10.

According to this, the degradation of the insertion loss in the pass band of the second filter 50 can be reduced or prevented while improving the steepness in a lower frequency range below the pass band of the first filter 10. Particularly, in the case where a transition band, which is the frequency band between the pass band of the first filter 10 and the pass band of the second filter, is narrow, for example, in the case where the value of (transition band/center frequency)×100 is less than or equal to 2%, advantageous effects of the present invention can be suitably produced.

Further, the first filter 10 may be a reception filter, and the second filter 50 may be a transmission filter.

According to this, the degradation of the insertion loss in the pass band of the transmission filter can be reduced or prevented while improving the steepness in a lower frequency range below the pass band of the reception filter.

Other Preferred Embodiments

The multiplexers according to preferred embodiments of the present invention have been described using the preferred embodiment and the working examples. However, other preferred embodiments realized by combining optional elements of the preferred embodiment and working examples described above, modified examples obtained by applying various modifications apparent to those skilled in the art to the preferred embodiments and working examples described above without departing the scope of the present invention, and radio frequency front-end circuits and communication devices each including a multiplexer according to a preferred embodiment of the present invention may also be included in the present invention.

In the foregoing section, the example in which the second filter 50 is a transmission filter is described. However, the present invention is not limited thereto, and the second filter 50 may alternatively be a reception filter. Further, the configuration of the multiplexer 1 is not limited to the configuration that includes both the transmission filter and the reception filter, and may alternatively be a configuration that includes only a transmission filter or only a reception filter.

Further, in the foregoing section, the multiplexer including two filters is described as an example. However, the preferred embodiments of the present invention are also applicable to, for example, a triplexer in which antenna terminals of three filters are connected together to a common terminal, or a hexaplexer in which antenna terminals of six filters are connected together to a common terminal. That is to say, the multiplexer may only need to include two or more filters.

Further, the configuration of the second filter 50 is not limited to the filter configuration described above and may appropriately be designed in accordance with required filter characteristics and the like. Specifically, the second filter 50 may have a longitudinally coupled type filter structure or a ladder type filter structure. Further, each of the resonators included in the second filter 50 is not limited to a SAW resonator and may alternatively be, for example, a BAW (Bulk Acoustic Wave) resonator. Moreover, the second filter 50 may be configured without using any resonator and may alternatively be, for example, a LC resonant filter or a dielectric filter.

Further, the materials that form the electrode layer 325 and the dielectric layer 326 of the interdigital transducer electrodes and the reflectors are not limited to the ones described above. Further, the interdigital transducer electrode does not need to have the foregoing multilayer structure. The interdigital transducer electrode may include, for example, a metal such as Ti, Al, Cu, Pt, Au, Ag, Pd, or the like or an alloy thereof, or may include a plurality of multilayer bodies each including the metal or the alloy described above.

Further in the preferred embodiments, as the substrate 320, the substrate having piezoelectricity is described. However, this substrate may alternatively be a piezoelectric substrate including a single piezoelectric layer. The piezoelectric substrate in this case includes, for example, a piezoelectric single crystal of LiTaO$_3$ or another piezoelectric single crystal such as LiNbO$_3$ or the like. Further, for the substrate 320 on which the interdigital transducer electrodes are formed, in addition to the one whose entirety is formed of a piezoelectric layer, any structure in which a piezoelectric layer is stacked on a support substrate may also be used as long as the substrate has piezoelectricity. Further, the cut angle of the substrate 320 according to the foregoing preferred embodiment is not limited to a particular value. That is to say, depending on required bandpass characteristics of an acoustic wave filter, the multilayer structure, the material, and the thickness may be changed if appropriate, and substantially the same advantageous effects may be produced even with a surface acoustic wave filter that uses a LiTaO$_3$ piezoelectric substrate, a LiNbO$_3$ piezoelectric substrate, or the like, with a cut angle other than the cut angle illustrated in the foregoing preferred embodiments.

Preferred embodiments of the present invention can be widely used in communication equipment such as mobile phones and the like as a multiplexer, a front-end circuit, or a communication device, each of includes which filter including the a longitudinally coupled acoustic wave resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal, a first terminal, and a second terminal;
   a first filter in a first path connecting the common terminal and the first terminal, a pass band of the first filter being a first frequency band; and
   a second filter in a second path connecting the common terminal and the second terminal, a pass band of the second filter being a second frequency band, the second frequency band being in a lower frequency range below the first frequency band; wherein
   the first filter includes a longitudinally coupled acoustic wave resonator including an interdigital transducer electrode group including a plurality of interdigital transducer electrodes along an acoustic wave propagation direction;
   the interdigital transducer electrode group has an asymmetric shape with respect to a center line that passes through a center of the interdigital transducer electrode group and is perpendicular or substantially perpendicular to the acoustic wave propagation direction; and
   of the plurality of interdigital transducer electrodes, an aggregate average of electrode finger pitches of the interdigital transducer electrodes connected to the first path on a common terminal side when seen from the longitudinally coupled acoustic wave resonator is smaller than an aggregate average of electrode finger pitches of the interdigital transducer electrodes connected to the first path on a first terminal side, and a sum of numbers of pairs of electrode fingers of the interdigital transducer electrodes connected to the first path on the common terminal side is less than a sum of numbers of pairs of electrode fingers of the interdigital transducer electrodes connected to the first path on the first terminal side.

2. The multiplexer according to claim 1, wherein the asymmetric shape of the interdigital transducer electrode group is defined by at least one of an average pitch of electrode fingers and the number of pairs of electrode fingers of the interdigital transducer electrode different on two sides of the center line in the acoustic wave propagation direction.

3. The multiplexer according to claim 2, wherein the asymmetric shape of the interdigital transducer electrode group is defined by the average pitch of electrode fingers and the number of pairs of electrode fingers of the interdigital transducer electrode different on two sides of the center line in the acoustic wave propagation direction.

4. The multiplexer according to claim 1, wherein the first filter includes a parallel arm resonator connected to the first path in between the common terminal and the longitudinally coupled acoustic wave resonator.

5. The multiplexer according to claim 1, wherein
the first filter includes a parallel arm resonator and a series arm resonator that are connected to the first path in between the common terminal and the longitudinally coupled acoustic wave resonator; and
in the first path, the series arm resonator is closer to the common terminal than the parallel arm resonator.

6. The multiplexer according to claim 1, wherein
a number of the plurality of interdigital transducer electrodes is an odd number; and
a number of the interdigital transducer electrodes connected on the common terminal side is less than a number of the interdigital transducer electrodes connected on the first terminal side.

7. The multiplexer according to claim 1, wherein a resonant frequency of a first order resonant mode generated by the longitudinally coupled acoustic wave resonator is in a frequency band between the pass band of the second filter and the pass band of the first filter.

8. The multiplexer according to claim 1, wherein
the first filter is a reception filter; and
the second filter is a transmission filter.

9. The multiplexer according to claim 1, wherein the common terminal is connected to an antenna element outside the multiplexer.

10. The multiplexer according to claim 1, wherein the common terminal defines and functions as an antenna terminal.

11. The multiplexer according to claim 1, further comprising an inductor connected between ground and a node between the common terminal and the first filter to perform matching.

12. The multiplexer according to claim 1, wherein the first filter includes first and second band pass filters each including a series arm resonator and a parallel arm resonator.

13. The multiplexer according to claim 1, wherein the first filter includes a first circuit and a second circuit, each of the first circuit and the second circuit including at least one series arm resonator and at least one parallel arm resonator.

14. The multiplexer according to claim 1, wherein the longitudinally coupled acoustic wave resonator includes a plurality of surface acoustic wave resonators.

15. The multiplexer according to claim 1, wherein the interdigital transducer electrode group includes seven interdigital transducer electrodes.

16. The multiplexer according to claim 1, wherein the asymmetric shape of the interdigital transducer electrode group is defined by different parameters in the interdigital transducer electrodes.

17. The multiplexer according to claim 1, wherein the longitudinally coupled acoustic wave resonator includes a piezoelectric substrate with a cut angle of about 120°±20° or about 300°±20°.

18. The multiplexer according to claim 17, wherein the longitudinally coupled acoustic wave resonator further includes an electrode layer on the piezoelectric substrate, and a dielectric layer covering the electrode layer.

19. The multiplexer according to claim 18, wherein the electrode layer includes a plurality of metal layers.

20. The multiplexer according to claim 1, wherein the second filter has a longitudinally coupled filter structure or a ladder type filter structure, and includes surface acoustic wave resonators or bulk acoustic wave resonators, or is a LC resonant filter or a dielectric filter.

* * * * *